United States Patent [19]

Crivello

[11] 4,245,029

[45] * Jan. 13, 1981

[54] PHOTOCURABLE COMPOSITIONS USING TRIARYLSULFONIUM SALTS

[75] Inventor: James V. Crivello, Elnora, N.Y.

[73] Assignee: General Electric Company, Schenectady, N.Y.

[*] Notice: The portion of the term of this patent subsequent to Nov. 15, 1994, has been disclaimed.

[21] Appl. No.: 67,613

[22] Filed: Aug. 20, 1979

Related U.S. Application Data

[63] Continuation of Ser. No. 822,152, Aug. 5, 1977, abandoned, which is a continuation-in-part of Ser. No. 638,982, Dec. 9, 1975, Pat. No. 4,058,401, which is a continuation of Ser. No. 466,374, May 2, 1974, abandoned.

[51] Int. Cl.$^3$ .............................................. G03C 1/68
[52] U.S. Cl. ....................... 430/280; 204/159.11; 204/159.18; 204/159.23; 204/159.24; 430/281; 430/286; 430/288; 528/90
[58] Field of Search ............... 96/115 R, 115 P, 35.1; 204/159.11, 159.18, 159.23, 159.24; 260/2 EF, 2 EC, 47 EN, 47 EC; 430/280, 281, 286, 288; 528/90

[56] References Cited

U.S. PATENT DOCUMENTS

| | | | |
|---|---|---|---|
| 3,721,616 | 3/1973 | Watt | 204/159.11 |
| 3,790,385 | 2/1974 | Steppan | 96/115 R |
| 3,816,280 | 6/1974 | Watt | 204/159.11 |
| 3,816,281 | 6/1974 | Feinberg | 204/159.11 |
| 3,895,952 | 7/1975 | Schlesinger | 96/115 R |
| 4,058,400 | 11/1977 | Crivello | 96/86 P |
| 4,058,401 | 11/1977 | Crivello | 430/280 |
| 4,156,055 | 5/1979 | Taso | 430/281 |

OTHER PUBLICATIONS

Ketley et al., Polymer Preprints, 19(E) 656 (1978) ACS Meeting, Miami, Fla. Sep. 1978.

*Primary Examiner*—Jack P. Brammer
*Attorney, Agent, or Firm*—William A. Teoli; James C. Davis, Jr.

[57] ABSTRACT

Photocurable compositions are provided based on the use of particular triarylsulfonium salts as photoinitiators for certain oxirane containing aliphatically unsaturated organic resins, such as acrylics, or mixtures of vinyl aromatic and unsaturated polyesters. A simultaneous free-radical cure and cationic cure of the aforesaid organic resins are achieved, which provides improved results, such as metal coatings having improved solvent resistance.

8 Claims, No Drawings

PHOTOCURABLE COMPOSITIONS USING TRIARYLSULFONIUM SALTS

This application is a continuation of copending application Ser. No. 822,152, filed Aug. 5, 1977, now abandoned, which is a continuation-in-part of my application Ser. No. 638,982 now U.S. Pat. No. 4,058,401, Photocurable Compositions Containing Group VIa Aromatic Onium Salts filed Dec. 9, 1975, which is a continuation application of application Ser. No. 466,374, filed May 2, 1974, now abandoned, all of these applications being assigned to the same assignee as the present invention.

The present invention relates to UV curable compositions and a method of curing, based on the simultaneous generation of free-radicals and a cationic curing catalyst. More particularly, the present invention relates to the use of a triarylsulfonium salt as a photoinitiator for the simultaneous free-radical and cationic cure of oxirane containing aliphatically unsaturated organic materials.

In my copending applications Ser. No. 638,981 now U.S. Pat. No. 4,058,400 and Ser. No. 638,982, now U.S. Pat. No. 4,058,401 filed Dec. 9, 1975 and assigned to the same assignee as the present invention, there is described the use of triarylsulfonium salts of the formula,

$$[(R)_3S]^+[MQ_d]^-, \quad (1)$$

where R is a monovalent aromatic organic radical, M is a metal or metalloid, Q is a halogen radical and d has a typical value of from 4–6, as initiators to effect the polymerization of various cationic polymerizable organic materials. In copending application Ser. No. 822,220, now abandoned, filed concurrently herewith for James V. Crivello and James E. Moore, for Photocurable Compositions and Method for Curing and assigned to the same assignee as the present invention, there is described the use of triarylsulfonium salts of formula (1) as a free radical photoinitiator for aliphatically unsaturated organic resins, e.g., acrylic resins and certain unsaturated polyester mixtures which are free of oxirane oxygen. In U.S. Pat. No. 3,028,361, Abrams et al, there is described the use of sulfonium salts as stabilizers for free radical polymerizable compositions, such as a polyester monomer composition. Based on the teaching of Abrams et al, the cure of the aforementioned polyester composition can be effected by the employment of a free-radical initiator, such as a peroxide catalyst, for example, benzoyl peroxide. Although the cure of such aliphatically unsaturated organic materials, either by way of free radicals, or by a cationic mechanism, improves the utility of starting aliphatically unsaturated organic material, coatings of such materials on various substrates often do not have the solvent resistance needed in particular applications. It would be desirable therefore to develop a technique whereby organic coatings formed by the cure of applied aliphatically unsaturated materials can be made in an improved manner to achieve characteristics not obtainable by techniques known to the art.

The present invention is based on the discovery that oxirane containing aliphatically unsaturated organic materials can be cured by a simultaneous free-radical and cationic mechanism, whereby improved characteristics are obtained in the final product, such as solvent resistance. Simultaneous free-radical and cationic cure of oxirane containing aliphatically unsaturated organic materials can be achieved in accordance with the practice of the present invention by the use of an effective amount of triarylsulfonium salts of formula (1) in such oxirane containing aliphatically unsaturated organic materials and the exposure of such photocurable compositions to radiant energy and preferably ultraviolet light.

There is provided by the present invention, photocurable compositions comprising (A) oxirane containing aliphatically unsaturated organic material and
(B) 0.1 to 15% by weight of (A) of a triarylsulfonium salt of formula (1).

Radicals included by R of formula (1) are, for example, $C_{(6-13)}$ aromatic hydrocarbon radicals, such as phenyl, tolyl, naphthyl, xylyl, anthryl, etc. Radicals included by M of formula (1) are metal or metalloids, such as a transition metal, for example Sb, Fe, Sn, Bi, Al, Ga, In, Ti, Zr, Sc, V, Cr, Mn, Cs, rare earth elements such as the lanthanides, for example, Ce, Pr, Nd, etc., actinides, such as Th, Pa, U, Np, etc., and metalloids such as B, P, As, etc.

Triarylsulfonium salts included by formula (1) are, for example,

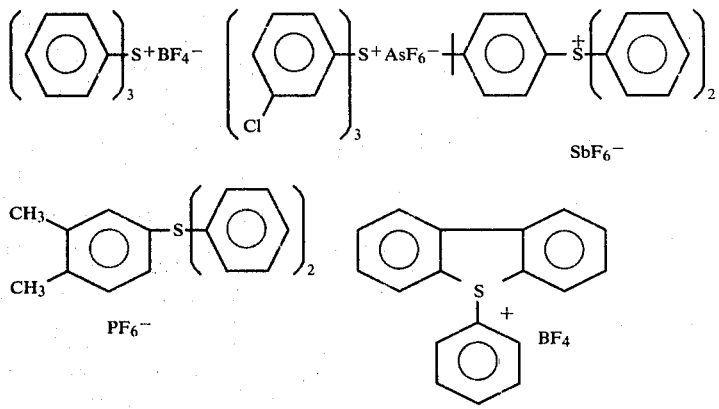

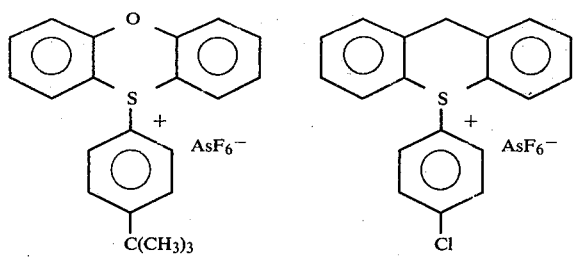

Triphenylsulfonium salts included in formula (1) can be made by procedures shown in J. W. Knapczyk and W. E. McEwen, J. Am. Chem. Soc., 91 145, (1969); A. L. Maycock and G. A. Berchtold, J. Org. Chem. Soc. 35, No. 8, 2532 (1970); H. M. Pitt, U.S. Pat. No. 2,807,648, E. Goethals and P. De Radzetzky, Bul. Soc. Chim. Belg., 73 546 (1964); J. M. Leicester and F. W. Bergstrom, J. Am. Chem. Soc., 51 (1929), etc.

A free radical cure also can be achieved with the triarylsulfonium salts of formula (1) with oxirane containing or aliphatically unsaturated polyesters, having chemically combined oxirane oxygen in combination with vinyl aromatic compounds, or such resins with or without chemically combined oxirane oxygen with compounds such as glycidyl acrylate, glycidyl methacrylate, bisphenol-A-diglycidyl ethers, 4-vinylcyclohexane dioxide, 3,4-epoxycyclohexyl-3',4'-epoxycyclohexane carboxylate, diglycidyl phthalate, cyclohexene oxide, 1,4-butanediol diglycidyl ether, $C_4$-$C_{30}$ α-alifin oxides, epoxy-novolac resins, such as DEN 431, DEN 438, DEN 439, manufactured by the Dow Chemical Company of Midland, Michigan, etc.

In addition to the above compounds, oxirane containing polymeric materials containing terminal or pendant epoxy groups also can be blended with the acrylic resins or the unsaturated polyester compositions described above. Examples of these materials are vinyl copolymers containing glycidyl acrylate or methacrylate as one of the comonomers. Other classes of epoxy containing polymers amenable to free radical cure using the above triarylsulfonium catalysts of formula (1) are epoxy-siloxane resins, epoxy-polyurethanes and epoxy-polyesters. Such polymers usually have epoxy functional groups at the ends of their chains. Epoxy siloxane resins and method for making are more particularly shown by E. P. Plueddemann and G. Fanger, J. Am. Chem. Soc. 81 632–5 (1959). As described in the literature, epoxy resins can also be modified in a number of standard ways, such as reaction with amines, carboxylic acids, thiols, phenols, alcohols, etc., as shown in U.S. Pat. Nos. 2,935,488; 3,235,620; 3, ; 1,379,653; 3,398,211; 3,403,199; 3,563,850; 3,567,797; 3,677,995; etc. Further examples of epoxy resins which can be used are shown in the Encyclopedia of Polymer Science and Technology, Vol. 6, 1976, Interscience Publishers, New York, pp 209–271.

There can be included with the above-described organic resins, 100 parts of fillers per 100 parts of organic resins and other materials such as flatting agents, thixotropic agents, dyes and pigments such as barytes, blanc fixe, gypsum, calcium carbonate, quartz, diatomaceous silica, synthetic silica, clay talc, asbestos, mica, bentonite, aerogels, glass fibers, basic carbonate, white lead, antimony oxide, lithophone, titanium dioxide, ultramarine blue, aluminum powder, etc.

Cure of the photocurable compositions of the present invention can be achieved by either heating the composition at a temperature in the range of from 150° C. to 250° C. or by use of radiant energy, such as electron beam or ultraviolet light. Electron beam cure can be effected at an accelerator voltage of from about 100 to 1,000 Kv. Cure of the compositions is preferably achieved by the use of UV irradiation having a wavelength of from 1849 Å to 4000 Å and an intensity of at least 5,000–80,000 microwatts per $cm^2$. The lamp system used to generate such radiation can consist of ultraviolet lamps such as from 1 to 50 discharge lamps, for example, xenon, metallic halide, metallic arc, such as a low, medium or high pressure mercury vapor discharge lamp, etc., having an operating pressure of from a few millimeters to about 10 atmospheres, etc., can be employed. The lamps can include envelopes capable of transmitting light of a wavelength of from about 1849 Å to 4000 Å, and preferably 2400 Å to 4000 Å. The lamp envelope can consist of quartz, such as Spectrocil, or Pyrex, etc. Typical lamps which can be employed for providing ultraviolet radiation are, for example, medium pressure mercury arcs, such as the GE H3T7 arc and the Hanovia 450 W arc lamp. The cures may be carried out with a combination of various lamps, some or all of which can operate in an inert atmosphere. When using UV lamps, the irradiation flux on the substrate can be at least 0.01 watts per square inch to effect cure of the organic resin within 1 to 20 seconds and permit the cure to be carried on continuously.

In order that those skilled in the art will be better able to practice the invention, the following examples are given by way of illustration and not by way of limitation. All parts are by weight.

EXAMPLE 1

Two solutions were prepared. The first solution consisted of glycidylacrylate containing 1% by weight of triphenylsulfonium chloride as a photoinitiator. The second solution consisted of glycidyl acrylate with 1% triphenylsulfonium hexafluoroantimonate.

Both solutions were spread to a thickness of 1 mil on steel plates and irradiated for 30 seconds at a distance of four inches from a G.E. H3T7 medium pressure mercury arc lamp. The coatings of both the samples were dry and hard.

Both samples were then immersed into methylethyl ketone. The sample cured with triphenylsulfonium chloride as the catalyst was removed after 1 minute, whereas the sample using triphenylsulfonium hexafluorophosphate was unaffected after 15 minutes immersion.

The above results demonstrate the superior solvent resistance of cured films based on the use of triphenylsulfonium hexafluoroantimonate, which is capable of initiating a simultaneous free-radical and cationic cure.

EXAMPLE 2

A blend of 66% by weight of an aliphatically unsaturated polyester in the form of a reaction product of isophthalic acid, fumaric acid and diethyleneglycol and 34% by weight of styrene and about 2% by weight of the blend of triphenylsulfonium hexafluoroarsenate was coated onto a steel panel and cured for 1 minute using a G.E. H3T7 medium pressure mercury arc lamp. The same procedure was repeated, except that in place of the aforementioned blend (A), there was used a blend of 33% by weight of aliphatically unsaturated polyester, 17% by weight of styrene and 50% by weight of a bisphenol-A-diglycidyl ether (Shell Epon 828). The latter blend (B) containing 2% by weight of the triphenylsulfonium hexafluoroarsenate was also applied onto a steel panel and irradiated following the same procedure.

The above 2 panels were immersed in a 50% aqueous sodium hydroxide solution. After one hour at 95° C., blend (A) free of oxirane oxygen was found to be completely degraded. However, blend (B) which contained the epoxy resin was found to be substantially unchanged. These results indicate that the simultaneous cure provided by the method and compositions of the present invention result in cured products having superior hydrolysis resistance. Hydrolysis degradation also occurred when benzoin butyl ether was substituted for the triphenylsulfonium salt as a free-radical initiator in blend (A).

EXAMPLE 3

A photocurable composition (C) was prepared by mixing together 98 parts of trimethylolpropane triacrylate and 2 parts of benzoin butyl ether. Composition (D) was prepared by blending together 98 parts of trimethylolpropane triacrylate and 2 parts of triphenylsulfonium hexafluoroantimonate. There was also blended together (E) 49 parts of trimethylolpropane triacrylate, 49 parts of bisphenol-A diglycidyl ether and 2 parts of triphenylsulfonium hexafluoroantimonate.

The above 3 photocurable mixtures were respectively coated to a thickness of about 2 mil onto steel panels. The respective steel panels were then cured in accordance with the procedure of Example 1. It was found that blends (C) and (D) required 5 minutes cure to produce a tack-free film, while blend (E) was cured within 30 seconds irradiation. The three coated steel panels were then respectively immersed in a 50% aqueous sodium hydroxide solution at 95° C. It was found that after 30 minutes the coatings from blends (C) and (D) were removed by hydrolysis, while the coating obtained from the cure of blend (E) remained substantially intact.

The above results establish that the simultaneous free-radical and cationic cure achieved in accordance with the practice of the invention provides superior resuts with respect to cure time and ability to resist alkaline hydrolysis at elevated temperatures.

EXAMPLE 4

A series of photocurable blends were prepared employing 2% by weight of the blend of triphenylsulfonium hexafluoroantimonate as the photoinitiator. The first blend consisted of lauryl acrylate and the second blend consisted of 3,4-epoxy cyclohexylmethyl-3',4'-epoxycyclohexanecarboxylate. Another blend consisted of about 78% by weight of the 3,4-epoxycyclohexylmethyl-3',4'-epoxycyclohexanecarboxylate and about 20% by weight of lauryl acrylate. The above three blends were respectively applied onto glass plates to a thickness of about 2 mil and thereafter cured for 1 minute under ultraviolet radiation as described above. The coated glass plates were then immersed in water to effect the removal of the respective films which were tack-free. The film made from the first blend was found to be very soft and extremely fragile. The film made from the second blend was hard, brittle and rigid and readily broke when it was attempted to bend it to an angle of 45°. The film obtained from the third mixture was tough and flexible and could be readily bent to 180° without breaking. These results establish that the simultaneous cure provided by the photocurable mixture of the present invention provides tough flexible films which could not be obtained by the practice of the procedures of the prior art.

EXAMPLE 5.

A series of photocurable mixtures were prepared containing about 3% by weight of triphenylsulfonium hexafluoroantimonate. Trimethylolpropane triacrylate was utilized in all of the mixtures which was further blended in particular instances with an oxirane containing material. The various mixtures were then applied onto a glass substrate to a thickness of 2 mils and exposed to a G.E. H3T7 lamp at a distance of about 8 inches to determine the period of time to convert the photocurable composition to a cured tack-free film. The following results were obtained, where "TMT" is trimethylolpropane triacrylate, "Initiator" is triphenylsulfonium hexafluoroantimonate, "VCD" is 4-vinylcyclohexene dioxide and "EPON 828" is a bisphenol-A diglycidyl ether:

| Mixture | WT% | Cure Time |
| --- | --- | --- |
| TMT | 97% | 5 min. |
| Initiator | 3% | |
| TMT | 87% | |
| VCD | 10% | 3.5 Min. |
| Initiator | 3% | |
| TMT | 73% | |
| VCD | 24% | 30 sec. |
| Initiator | 3% | |
| TMT | 73% | |
| EPON 828 | 24% | 30 sec. |
| Initiator | 3% | |

The above results show that mixtures of acrylate and the triphenylsulfonium initiator containing a minor amount of oxirane containing material can be cured in air in a relatively short period of time. One possible explanation is that the oxirane containing material eliminates the effect of oxygen inhibition because the cationic polymerization precedes the free-radical polymerization.

In addition to the triarylsulfonium salts of formula (1), there also can be used in the photocurable compositions of the present invention triarylsulfonium salts of the formula $$[(R)_a(R^1)_bS]^+[MQ_d]^-, \qquad (2)$$

where R is selected from the group consisting of a $C_{(6-13)}$ aromatic hydrocarbon radical and a heterocyclic radical and substituted derivatives thereof, $R^1$ is a divalent aromatic hydrocarbon radical, a divalent heterocyclic radical and substituted derivatives thereof, "a" is 1 or 3, "b" is 0 or 1, "S" has a valence of 3 which can be satisfied by R alone or a combination of R and $R^1$, and "MQd" is as previously defined.

Although the above examples are directed to only a few of the very many variables which are included by the photocurable compositions of the present invention and the method of curing such compositions, it should be understood that a much broader variety of photocurable compositions are encompassed within the scope of the present invention as shown by the description preceding these examples.

What I claim as new and desire to secure by Letters Patent of the United States is:

1. Photocurable compositions comprising
   (A) a mixture of an aliphatically unsaturated organic material free of oxirane oxygen and oxirane containing monomeric or polymeric organic material and
   (B) 0.5 to 15% by weight photocurable composition of a triarylsulfonium salt of the formula,

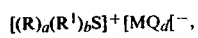

$[(R)_a(R^1)_bS]^+[MQ_d]^-$, where R is selected from the group consisting of a $C_{(6-13)}$ aromatic hydrocarbon radical, a heterocyclic radical, and substituted derivative thereof, $R^1$ is selected from the group of a divalent aromatic hydrocarbon radical, a divalent heterocyclic radical and substituted derivatives thereof, "a" is 1 or 3, "b" is 0 or 1, the valence of S can be satisfied by R alone or a combination of R and $R^1$, "M" is a metal or metalloid, "Q" is a halogen radical and "d" has a value of from 4-6 inclusive.

2. A photocurable composition in accordance with claim 1, where the triarylsulfonium salt is a triphenylsulfonium salt.

3. A composition in accordance with claim 1, where the triarylsulfonium is triphenylsulfonium hexafluoroarsenate.

4. A photocurable composition in accordance with claim 1, where the oxirane containing aliphatically unsaturated organic material is glycidyl acrylate.

5. A photocurable composition in accordance with claim 1, where the photocurable composition is a mixture of an epoxy resin, an unsaturated polyester and styrene.

6. A photocurable composition in accordance with claim 1, where the photocurable composition is a mixture of an epoxy resin, methylmethacrylate and polymethylacrylate.

7. A composition in accordance with claim 1, where the aliphatically unsaturated organic material free of oxirane oxygen is a polyacrylate.

8. A photocurable composition in accordance with claim 1, where the aliphatically unsaturated organic material free of oxirane oxygen is trimethylolpropane triacrylate.

* * * * *